United States Patent [19]

Havemann et al.

[11] Patent Number: 4,835,580
[45] Date of Patent: May 30, 1989

[54] SCHOTTKY BARRIER DIODE AND METHOD

[75] Inventors: Robert H. Havemann, Garland; Robert H. Eklund, Plano, both of Tex.

[73] Assignee: Texas Instruments Incorporated, Dallas, Tex.

[21] Appl. No.: 45,025

[22] Filed: Apr. 30, 1987

[51] Int. Cl.[4] ............................................. H01L 29/48
[52] U.S. Cl. ...................................... 357/15; 357/34; 357/55
[58] Field of Search ...................... 357/34, 15, 55, 86

[56] References Cited

U.S. PATENT DOCUMENTS 4,586,071  4/1986  Tiwari .................................. 357/34

FOREIGN PATENT DOCUMENTS 0112773  7/1984  European Pat. Off. ............... 357/15

OTHER PUBLICATIONS

IBM Technical Disclosure Bulletin by Levi, vol. 20, #8, p. 3127, Jan. 1978.

Primary Examiner—Andrew J. James
Assistant Examiner—Mark Prenty
Attorney, Agent, or Firm—Larry C. Schroeder; Leo N. Heiting; Melvin Sharp

[57] ABSTRACT

The preferred embodiments include Schottky barrier diode (80) clmaped bipolar transistors for use in planar integrated circuits with the diode (80) being formed in a trench to increase junction area, reduce series resistance from junction to the buried layer (64), and reduce lateral extent of the extrinsic base (78).

6 Claims, 7 Drawing Sheets

SCHOTTKY BARRIER DIODE AND METHOD

BACKGROUND OF THE INVENTION

1. Field of the Invention.

The present invention relates to electronic semiconductor devices and fabrication methods, and more particularly, to Schottky barrie diodes including diodes formed in integrated circuits.

2. Description of the Related Art.

Schottky barrier diodes are widely used in integrated circuits in applications such as decoupling devices in digital circuits (silicon bipolar and gallium arsenide MESFET) and as clamping devices to prevent heavy saturation of bipolar transistors. See, for example, A. Milnes, Semiconductor Devices and Integrated Electronic § 2.5 (Van Nostrand Reinold 1980) and S. Sze, Physics of Semiconductor Devices § 5.6 (Wiely-Interscience 2 d Ed 1981). Generally, a Schottky barrier diode is formed by deposition of suitable barrier metal into a contact opening through a silicon dioxide sulating layer down to bare silicon. The barrier metal may be reacted with the silicon to form a silicide-to-silicon junction (for example, Pt is deposited and reacted to form PtSi and is used as a high barrier diode on n-type silicon for biplor transistor clamping, and Ti is deposited and reacted to form $TiSi_2$ and is used as a low barrier diode for logic circuits) or may be left unreacted and form a metal-to-silicon junction (for example, TiW is used as a low barrier diode and Al as a high barrier diode on n-type silicon). Note that the reaction-formed silicide may be self-aligned because of the reaction with silicon: that is, a metal is uniformly deposited but only the portion in contact with bare silicon reacts so the unreacted metal away from the silicon can be selectively removed. Of course, a silicide could be directly deposited which would avoid the need for reaction of the metal with the silicon but would not yield a self-aligned structure.

The specific contact resistivity for a metal-to-heavily dope silicon junction is approximated by:

$$\exp\left(\frac{2\sqrt{\epsilon m}}{\hbar} \frac{\phi}{\sqrt{N}}\right)$$

with $\phi$ the metal-silicon barrier height, N the doping concentration, m the carrier effective mass, and $\epsilon$ the dielectric permittivity of silicon; so degenerately ddoped (either p or n) silicon will form an ohmic junction with a metal.

The development of bipolar VLSI circuits, such as gate arrays and signal processors, requires Schottky barrier diodes with high performance but with small size. Effects such as series resistances and parasitic p-n junctions must be minimized, and as devices are scaled down, the reduction of size of a Schottky barrier clamp diode becomes increasing difficult without the concurrent reduction of clamp efficiency and increase of series resistance to levels that significantly degrade circuit performance.

Various approaches to down-scaling Schottky barrier diodes include a self-aligned guard ring clamp diode structure in Y. Okada et al, A New "SICOS" Schottky Device, 1985 IEEE IEDM Tech. Dig. 38 and guard ring-less $VSi_2$ Schottky barrier diodes in V. Drobny, Nearly Ideal Unguarded Vanadium-Silicide Schottky-Barrier Diodes, 33 IEEE Tr. Elec. Dev. 1294 (1986). The avoidance of a guard ring may also be accomplished by moat etching to reduce field crowding at the periphery at the barrier metal; see C. Rhee et al, Moat-Etched Schottky Barrier Diode Displaying Near Ideal I-V Characteristics, 15 Soild State Elec. 1181 (1972). The moat etching also reduces the series resistance due to the thinning of the silicon.

However, these approaches fail to overcome the problems of the known Schottky barrier diodes of increase in series resistance and decrease in clamp efficiency due to the down-scaling of the diode.

SUMMARY OF THE INVENTION

The present invention provides Schottky barrier diodes formed in trenches in an integrated circuit substrate; the trenches extend through the extrinsic base of a bipolar transistor to the collector and form a clamp diode that is partially vertical. The three dimensional junction increases diode area without increasing the chip area occupied by the diode and decreases the distance to a buried layer which decreases diode series resistance.

The increased diode area and decreased distance to a buried layer reduce diode series resistance and increases clamp efficiency; this solves the corresponding problems of the known diodes. Further, such trench diodes used as clamp diodes may also reduce extrinsic base size and thereby decrease base-collector capacitance.

BRIEF DESCRIPTION OF THE DRAWINGS

The drawing are schematic for clarity.

DESCRIPTION OF THE PREFERRED EMBODIMENTS

Figure 1A:
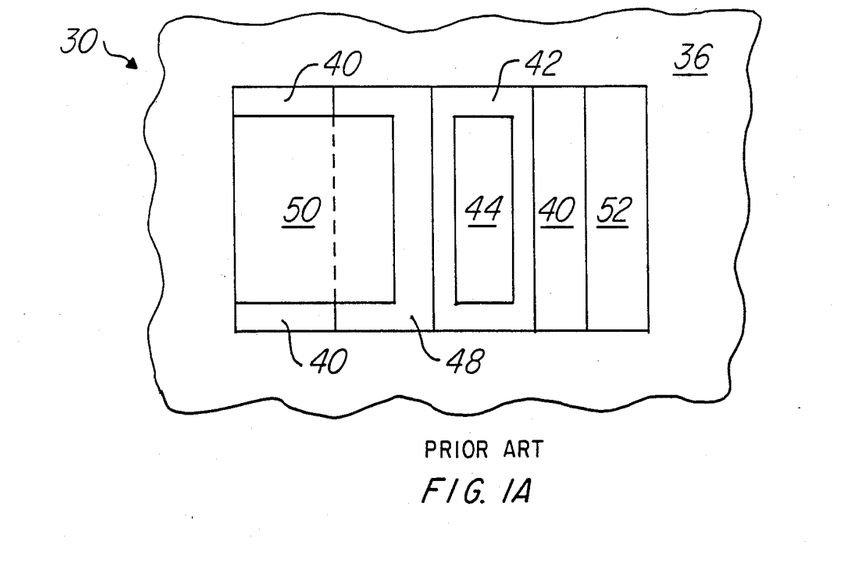
FIGS. 1A-B are plan and cross sectional elevation views of a prior art clamped bipolar transistor.
Figure 1B:
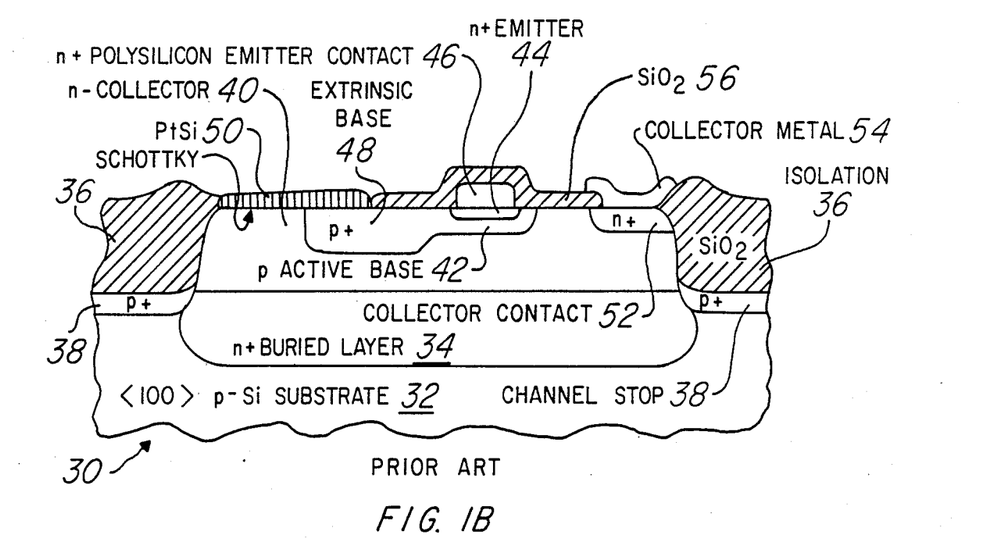

FIGS. 1A-B show in plan and cross sectional elevation views an example of a known Schottky-barrier-clamped n-p-n silicon bipolar transistor, generally denoted 30, which includes $p^{31}$ silicon substrate 32, $n^+$ buried layer 34, silicon dioxide (oxide) isolation 36, $p^+$ channel stops 38, $n^-$ collector 40, p active base 42, $n^+$ emitter 44, $n^+$ polysilicon emitter contact 46, $p^+$ extrinsic base 48, platinum silicide (PtSi) layer 50 which forms a Schottky barrier diode with collector 40 and an ohmic contact with extrinsic base 48, $n^+$ collector contact 52, collector metal contact 54, and insulation oxide 56. FIG. 1A is a plan view with emitter contact 46, collector metal 54 and oxide 56 removed for clarity; also in both Figures insulation layers, interconnections, electrodes, and packaging are not shown for simplicity.

PtSi 50 forms a Schottky barrier diode to clamp the collector-base junction (to a mximum forward bias of 0.5 V) and prevent forward bias saturation.

The series resistance of the diode of FIGS. 1A–B is a function of the junction area and the resistive path to the n+ buried layer, which in turn is a function of the n− epilayer thickness and resistivity. Because epilayer thickness and resistivity is typically determined by performance considerations of bipolar transistors and other devices in an integrated circuit including the diode, and because diode area is often also dicatated by other device and layout considerations, there is limited opportunity for optimization of diode characteristics.

Figure 2A:
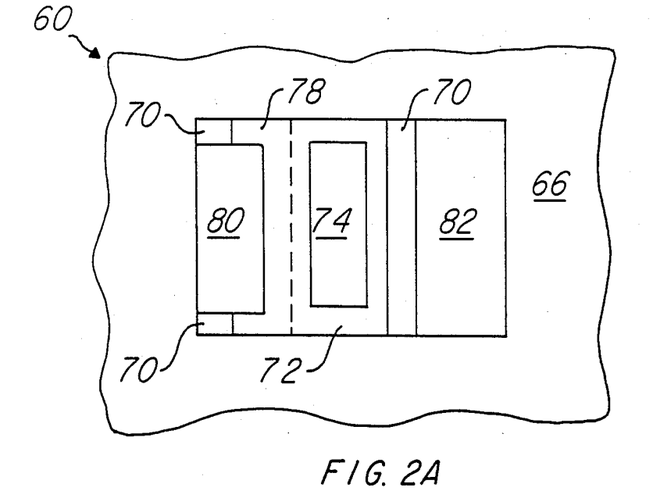
FIGS. 2A-B are plan and cross sectional elevation views of a first preferred embodiment clamped bipolar transistor.
Figure 2B:
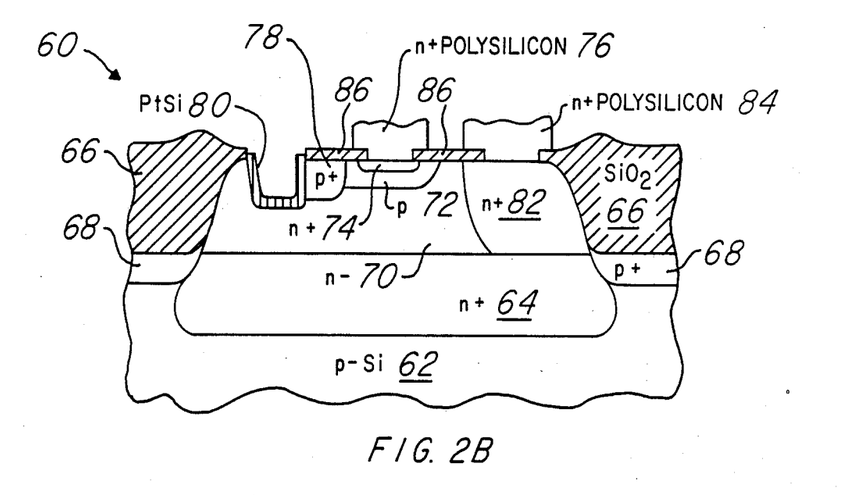

A first preferred embodiment Schottky-barrier-clamped silicon bipolar transistor is illustrated in plan and cross sectional elevation views in FIGS. 2A–B and denoted by reference numeral 60. Transistor 60 is analogous to transistor 30 and includes p− silicon substrate 62, n+ buried layer 64, oxide isolation 66, p+ channel stops 68, n− collector 70, p active base 72, n+ emitter 74, n+ polysilicon emitter contact 76, p+ extrinsic base 78, PtSi layer 80 which forms a Schottky barrier diode with collector 70 and an ohmic contact with extrinsic base 78, n+ collector contact 82, n+ polysilicon collector contact 84, and insulation oxide 86. FIG. 2A is a plan view with emitter polysilicon contact 76, collector polysilicon contact 84 and oxide 86 removed for clarity; again, in both Figures insulation layers, interconnections, electrodes, and packaging are not shown for simplicity.

PtSi 80 along the sidewalls of a trench into extrinsic base 78 and collector 70 provides the clamp analogous to PtSi 50 in transistor 30. The advantages of PtSi 80 in a trench over a planar clamp diode occupying the same surface area include: (i) the diode junction area is larger because the vertical trench sidewalls contribute; (ii) the series resistance is smaller due to the reduce distance from the diode junction to the buried layer; and (iii) the reduced lateral extent of the extrinsic base implies smaller base-collector capacitance. In effect, the use of a trench permits optimization of the diode independent of optimization of the bipolar transistor.

Further features and characteristics of transistor 60 will be apparent from consideration of a first preferred embodiment method of fabrication which includes the following steps which are illustrated in cross sectional elevation views in FIGS. 3A–D.

(a) Start with lightly doped ($10^{15}$ atoms/cm$^3$) p-type silicon substrate 62 oriented <100>. Oxidize substrate 62 to form a layer of oxide about 3000 Å thick, and open a window in the oxide using the buried-layer mask. Implant arsenic or antimony through the window and drive in the implant in a oxidizing atmosphere to form buried layer 64 about 2.5 μm thick and 7 μm by 10 μm. The different rates of oxidation between the buried layer 64 exposed through the window and the surrounding oxide-covered portion of substrate 62 leads to a step in the silicon surface at the buried layer perimeter. Strip the oxides and epitaxilly grow epilayer 70 with in situ n− doping and a thickness of 1.0 μm; the step at the buried layer perimeter propagates through epilayer 70 and serves as an alignment mark. See FIG. 3A.

(b) Deposit stress-relief oxide and silicon nitride; and etch the oxide/nitride using photoresist patterned with the complement of the buried-layer mask. Implant self-aligned channel stop boron 68 before the photoresist for the oxide/nitride etch is removed. Grow isolation oxide 66 in steam with the oxide/nitride acting as an oxidation barrier; the growth of oxide 66 depletes channel stop boron 68 by segregation into the oxide, so a through-field channel stop implant may be useful. Also, the channel stop formation could be dine prior to the growth of epilayer 70 by a shallow implant or a diffusion. Strip oxide/nitride together with an etch of oxide 66 to roughly planarize the surface; see FIG. 3B.

(c) Deposit insulation oxide 86 to a thickness of 0.05 μm and photolithographically form a mask on oxide 86 for collector contact 82. Implant phosphorus through the exposed oxide and drive it in to form n+ collector contact 82. Strip the mask and form a second mask to define base 72; implant boron through the exposed oxide to form p base 72 to a depth of 0.3 μm. Strip the second mask and form a thrid mask to define extrinsic base 78; implant boron through the exposed oxide to form p+ extrinsic base 78 to a depth of 0.3 μm. Strip the third mask and deposit more oxide 86 to increase the thickness up to 0.25 μm. Form a fourth mask to define openings (about 1 μm by 3 μm) in oxide 86 for polysilicon emitter contact 76 and polysilicon collector contact 84, and etch oxide 86 using this mask. Strip the mask. Deposit polysilicon to a thickness of 0.3 μm and dope the polysilicon n+ by implanting phosphorus at 80 keV with a dose of $2 \times 10^{16}/cm^2$. Form a fifth mask to define polysilicon emitter contact 76, polysilicon collector contact 84, plus interconnection lines, and etch the polysilicon to form the contacts and lines; see FIG. 3C which illustrates the overlap of the polysilicon contacts onto oxide 86.

(d) Anneal 900° C. for twenty minutes to drive phosphorus out of polysilicon emitter contact 76 into base 72 to form emitter 74 to a depth of 0.15 μm; this also anneals the base implants and slightly extends extrinsic base 78. Form a sixth mask to define the location of the trench for PtSi 80, and anisotropically etch (for example, plasma etch the silicon with HBr+HCl) through the exposed oxide 86 and into extrinssic base 78 and collector 70 to form the trench to a depth of 0.4 μm. See FIG. 3D. Alternatively, the trench etch could be part of the polysilicon etch: the fourth mask would include an opening in oxide 86 for the trench and the polysilicon would be overetched to also etch out the trench.

Figure 3A:
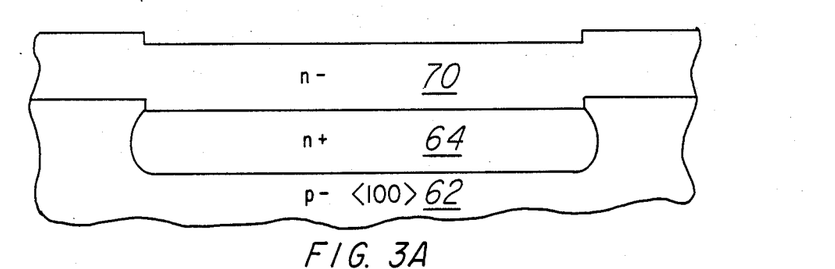
FIGS. 3A-D are cross sectional elevation views of the steps of a first preferred embodiment method of fabrication of the first preferred embodiment transistor.
Figure 3B:
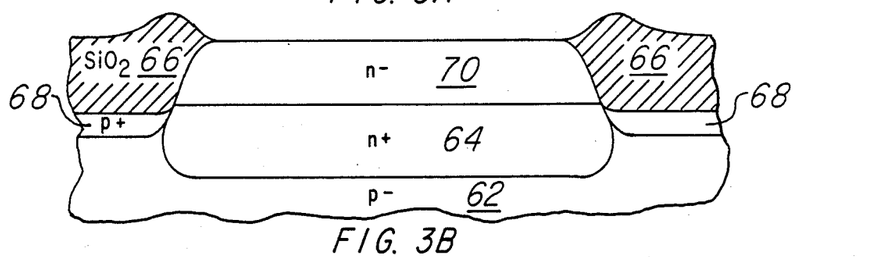
Figure 3C:
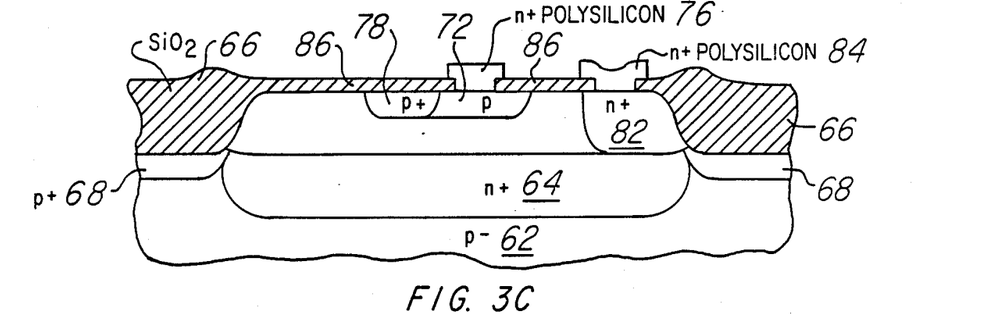
Figure 3D:
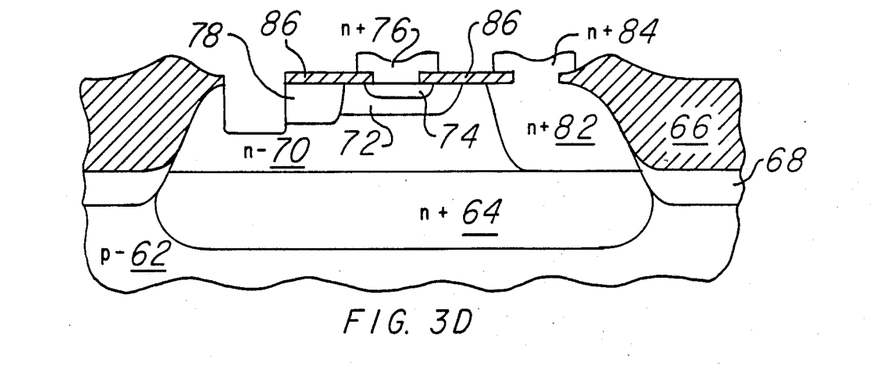

(e) Sputter deposit a 0.05 μm thick conformal layer of platinum (this will produce a 0.1 μm thick layer of silicide after reaction because Pt consumes about 1.3 times its own thickness of silicon to form PtSi about 2.0 times the original Pt thickness). Raise the temperature to 450°–525° C.; the platinum reacts with the abutting silicon to form PtSi but does not react with the abutting oxide. Strip the unreacted platinum with aqua regia. Note that PtSi forms ohmic junctions with p+ and n+ doped silicon, so the junction with base 78 is ohmic. However, the junction of PtSi 80 with n+ collector 70 forms a Schottky barrier diode.

This completes the transistor as illustrated in FIGS. 2A–B. Further processing steps that would typically follow include selectively filling the trench with tungsten (WF$_6$+3H$_2$→6HF+W is catalyzed by PtSi and W) and depositing and patterning interlevel dielectric (typically oxide) and Ti:W diffusion barrier plus aluminum for interconnections.

Figure 4:
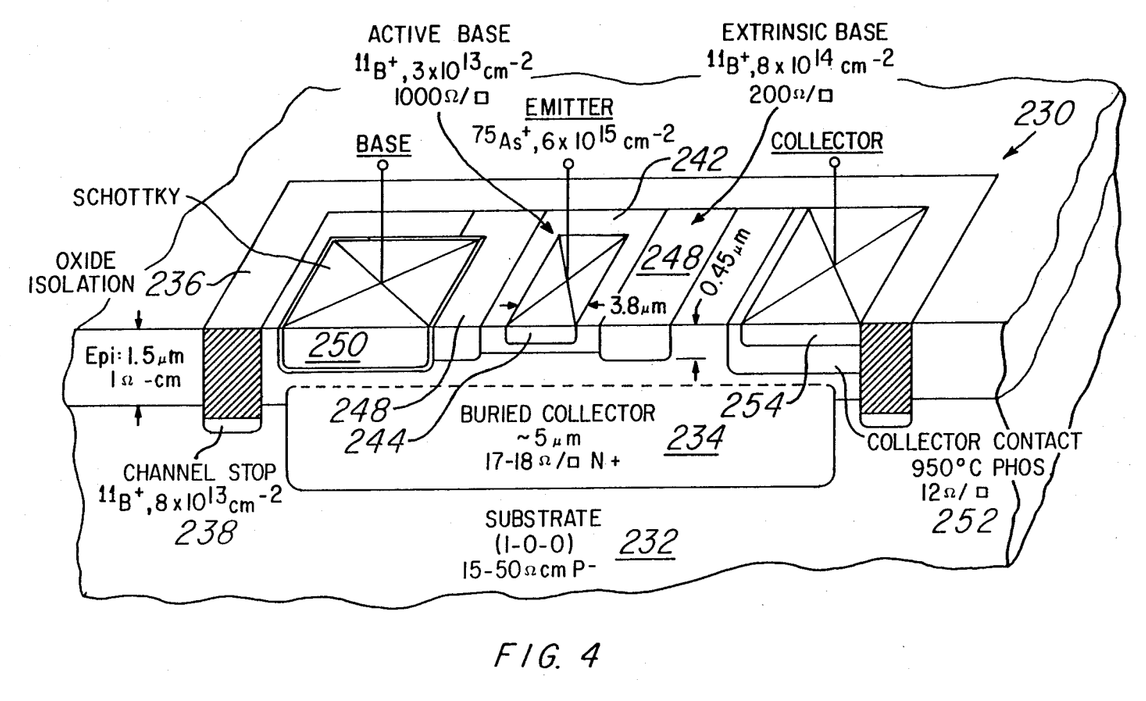
FIG. 4 is a cross sectional elevation view of a second preferred embodiment Schottky barrier diode.

Second preferred embodiment clamped bipolar transistor, illustrated in cutaway perspective view in FIG. 4 and generally denoted 230, includes includes p−silicon substrate 232, n+buried layer 234, oxide islotion 236, p+channel stops 238, n−collector 240, p active base 242, n+emitter 244, p+extrinsic base 248, PtSi layer 250 which forms a Schottky barrier diode with collector 240 and an ohmic contact with extrinsic base 248, n+ collector contact 252, collector metal contact 254; again, insulation layers, interconnections, electrodes, and packing are not shown for simplicity.

Clamped transistor 230 is similar to clamped transistor 60 but with oxide filled trench isolation, an implanted emitter with metal contact, and a diffused collector contact. Collector contact 252 could extend down to meet buried layer 234. Fabrication is also similar, although two trenches (one for oxide isolation 236 and one for Schottky barrier diode 250) are used. The dimensions and doping levels for various elements are noted in FIG. 4.

Logic Schottky barrier diodes are used in STL (Schottky transistor logic) and require very low barriers (typically 0.2 volts). Barrier metals such as tungsten, Ti:W (a pseudoalloy of 10% by weight titanium) and TiSi$_2$ which may be self-aligned by reactiton of titanium deposited on the silicon) are typically used.

Figure 5A:
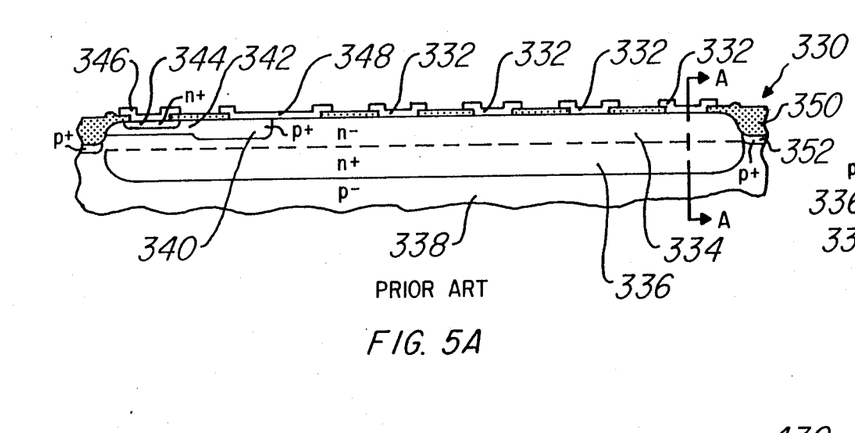
FIGS. 5A-B are cross sectional elevation views of a prior art STL cell.
Figures 5B, 6B:
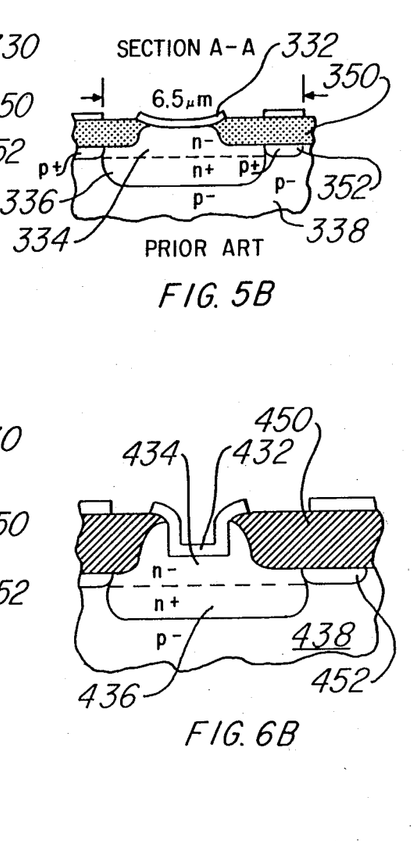
FIGS. 6A-B are cross sectional elevation views of a third preferred embodiment STL cell.

FIG. 5A-B show in cross sectional elevation views a known STL cell, generally denoted 330, which includes four Ti:W Schottky barrier collector contacts 332, n− silicon collector 334, n+ buried layer 336, p− substrate 338, p+ extrinsic base 340, p intrinsic base 342, n+ emitter 344, Ti:W emitter contact 346, Ti:W base/collector clamp Schottky barrier diode 348, oxide isolation 350, and channel stops 352.

Figure 6A:
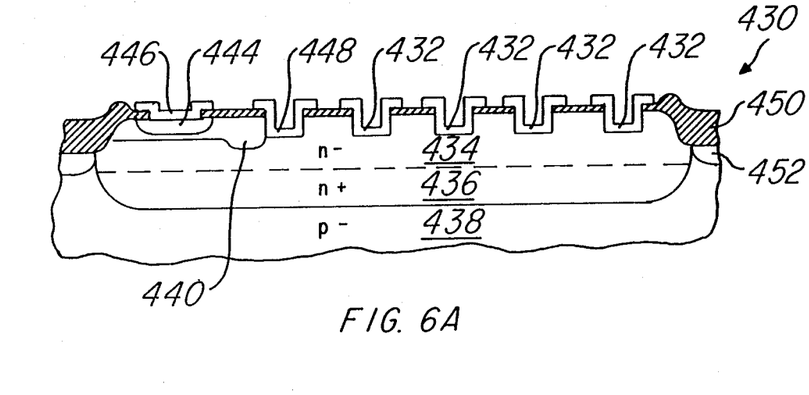

FIGS. 6A-B show in cross sectional elevation views a third preferred embodiment STL cell, generally denoted 430, which includes elements analogous to those of cell 330 but with trenched Schottky barrier diodes. The trenched Schottky barrier diodes lessen series resistance for both the output collector diodse 432 and the clamp diode 448, lessen the base-collector capacitance and extrinsic base size, and decrease the surface area occupied by cell 430 compared to cell 330. Each of the Schottky barrier diodes occupies a surface area of roughly 1 μm by 2 μm. The elements of cell 430 are numbered with numerals equals to 100 plus the corresponding numeral for the analogous element of cell 330; in particular, cell 430 includes four Ti:W Scottky barrier collector contacts 432, n− silicon collector 434, n+ buried layer 436, p− substrate 438, p+ extrinsic base 440, p intrinsic base 442 n+ emitter 44, Ti:W emitter contact 446, Ti:W base/collector clamp Schottky barrier diode 448, oxide isolation 450, and channel stops 452.

Cell 430 may be fabricated in the same manner as cell 330 but with masked trench etch prior to deposition of the Ti:W to form Schottky barriers.

Generally, in addition to reduction of the series resistance of Schottky barrier diodes, the trench of the preferred embodiment permits a large diode area to be fabricated for a given lithographic linewidth (minimum feature size) and eliminates the metal corner of planar diodes so a guard ring is not needed.

Figure 7:
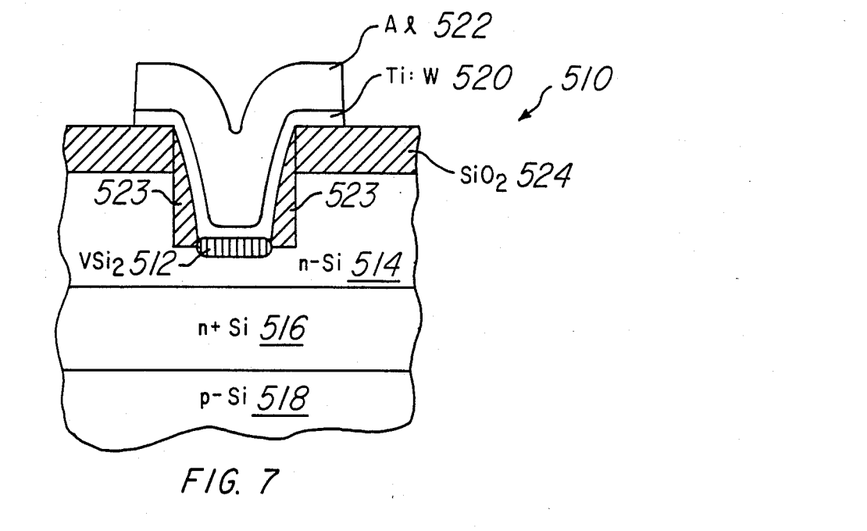
FIG. 7 is a cross sectional elevation view of a fourth preferred embodiment.

Fourth preferred embodiment Schottky barrier diode, generally indicated with reference numeral 510, is illustrated in schematic cross sectional elevation view in FIG. 7 and includes the junction of VSi$_2$ 512 with n− silicon epilayer 514. Also shown are n+ silicon buried layer 516, p− silicon substrate 518, Ti:W diffusion barrier 520, aluminum interconnection line 522, sidewall dielectric 523, and insulation oxide 524. Diode 510 could be used in place of any of the logic diodes in third preferred embodiment STL cell 430, but not the clamp diode 448 because the sidewall of diode 448 makes the contact with extrinsic base 440. Dielectric 523 is CVD oxide deposited at low temperature and diode 510 may be fabricated in a manner similar to the fabrication of the other trench diodes of the preferred embodiments with the additional steps of conformally depositing a layer of dielectric after the trench etch and anisotropically plasma etching the layer to leave just the sidewall filaments 523. The vanadium is then deposited and reacted at about 600° C. in an argon plus hydrogen atmosphere for about 5-15 minutes to form the silicide.

A diode 510 which occupies the same substrate surface area as a diode 332 of FIGS. 5A-B has the advantages over such diode of having as a smaller distance from the junction to the buried layer, and a diode 510 has an advantage over a diode 432 of FIGS. 6A-B of eliminatating the sidewall junction capacitance.

Figure 8:
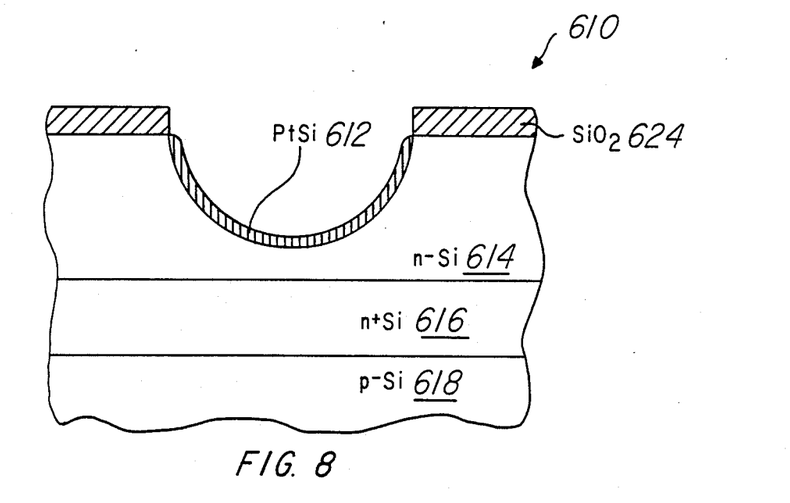
FIG. 8 is a cross sectional elevation of a fifth preferred embodiment.

A fifth preferred embodiment Schottky barrier diode, generally denoted by reference numeral 610, is illustrated in cross sectional elevation view FIG. 8 and includes PtSi 612 forming a Schottky barrier with n− silicon 614, n+ buried layer 616, p− substrate 618, and oxide 624. Diode 610 shows the possibility of a not rectangular trench; the spherical trench of diode 610 made be fabricated by isotropic etching with a mask having an opening smaller than the final surface area occupied by diode 610. Diode 610 could also be made of low Schottky barrier material and used in place of any of the diodes of the preferred embodiments; the advantages of diode 610 include the elimination of any corners and resultant electric field line crowding.

Figure 9A:
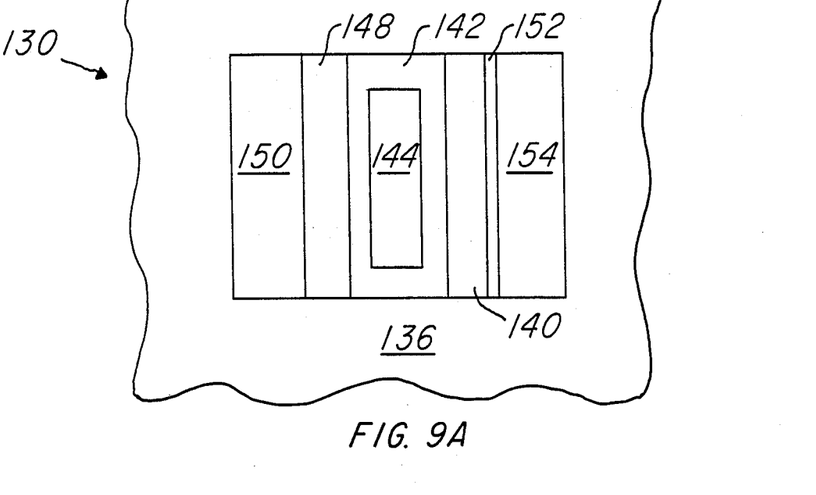
FIGS. 9A-B are plan and cross sectional elevation views of a sixth preferred embodiment.
Figure 9B:
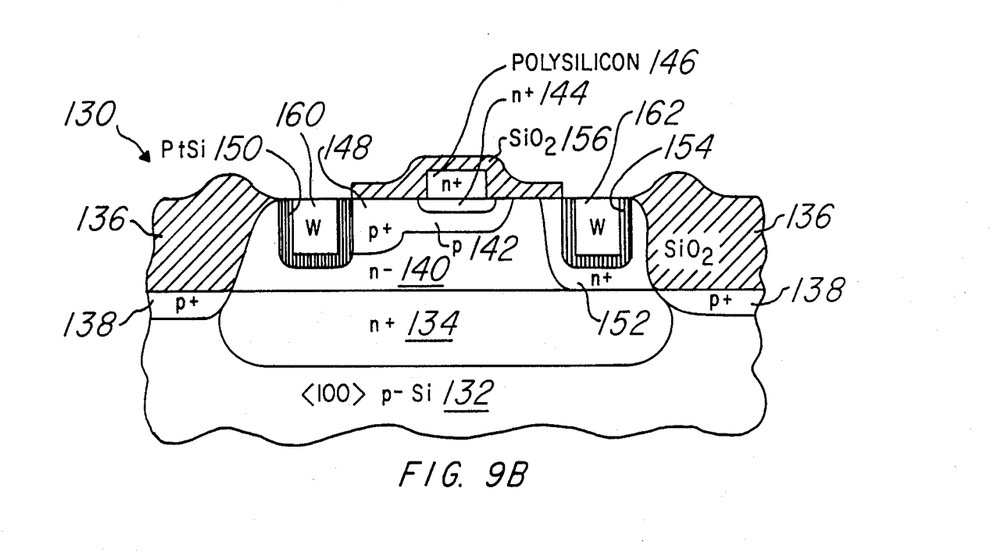

A sixth embodiment Schottky-barrier-clamped silicon bipolar transistor is illustrated in plan and cross sectional elevation views in FIGS. 9A-B and denoted by reference numeral 130. Transistor 130 is analogous to transistor 30 and includes p− silicon substrate 132, n+ buried layer 134, oxide isolation 2.5 p+ channel stops 68, n− collector 140, p active base 142, n+ emitter 144, n+ polysilicon emitter contact 146, p+ extrinsic base 148, PtSi layer 150 which forms a Schottky barrier diode with collector 140 and an ohmic contact with extrinsic base 148, n+ collector contact 152, PtSi collector metal contact 154, insulation oxide 156, and tungsten plugs 160 and 162 in the diode trenches. FIG. 9A is a plan view with emitter contact 146, collector metal 154 and oxide 156 removed for clarity; again, in both Figures insulation layers, interconnections, electrodes, and packaging are not shown for simplicity.

MODIFICATIONS AND ADVANTAGES

Various modifications of the preferred embodiment devices and methods may be made while retaining the feature of trench diode. For example, the dimensions and shapes and materials used in the preferred embodiments may be varied, such as used of CoSi$_2$ silicide, a Schottky barrier with p type silicon as would be needed to clamo p-n-p transistors, Al$_x$Ga$_{1-x}$As heterojunction transistors, backside contacts through vias instead of the buried layers, silicon-on-insulator substrates, and large area power devices. The trenches may be formed by orientation dependent etching, the silicon substrate could be oriented <111>, the buried layer may be doped with arsenic, and so forth. Both high barrier clamp diodes and low barrier logic diodes may be fabricated on the same substrate by use of two separate masking steps. Note that for planar heterojunction transistors with the emitter down configuration (as in HI²L technology), the base requires a vertical contact and this could be by means of the trench Schottky barrier diode; the collector contact would be the sidewall contact.

The topography of substrates with trench diodes may be improved by use of a selective tungsten trench refill or metal deposition plus planarization just after diode formation but before metallization. And the trench diodes for clamping bipolar transistor may be used with lateral transistor or as output diodes for integrated Schottky logic structures.

Similarly, trenched junction logic diodes may be formed analogously to the Schottky barrier diodes of the preferred embodiments: prior to the metal deposition step a masked p doping step is inserted.

The invention provides trenched clamp diodes with the advantage of increased clamping efficiency for bipolar transistors.

What is claimed is:

1. A Schottky barrier clamped bipolar transistor, comprising:
   (a) emitter and collector regions in a substrate, said emitter region comprising a semiconductor doped a first conductivity type and said collector region comprising a semiconductor doped said first conductivity type;
   (b) a base region in said substrate and between said emitter and collector regions, said base region comprising a semiconductor doped a second conductivity type, said second conductivity type opposite said first conductivity type;
   (c) a trench in said substrate, a portion of a surface of said trench abutting said base region and another portion of said surface abutting said collector region;
   (d) a metal layer on at least a portion of said surface, said metal layer forming an ohmic contact with said abutting base region and forming a Schottky barrier diode with said abutting collector region;
   (e) said trench surface including sidewalls and a bottom, said base region abutting a portion of said sidewalls, and said collector region abutting at least a portion of said bottom; and
   (f) said base region includes an intrinsic base region plus an extrinsic base region, said extrinsic base region more heavily doped than said intrinsic base region, and said extrinsic base abuts said portion of said sidewalls.

2. The transistor of claim 1, wherein;
   (a) said emitter is n+ doped silicon;
   (b) said collector is n− doped silicon;
   (c) said base includes an extrinsic base made of p+ doped silicon and an intrinsic base made of p doped silicon; and
   (d) said metal layer is made of platinum silicide.

3. The transistor of claim 1, wherein:
   (a) said transistor is a planar heterojunction transistor with said collector region at the substrate surface and said emitter region buried;
   (b) said emitter region made $Al_xGa_{1-x}As$ and said base and collector regions made of GaAs.

4. An integrated circuit, comprising:
   (a) a plurality of bipolar transistors in a substrate, each of said transistor with a Schottky barrier diode clamp formed in a trench in said substrate;
   (b) a plurality of Schottky barrier logic diodes, each of said diodes formed in a trench in said substrate; wherein
   (c) the Schottky barriers of said clamp are higher than the Schottky barriers of said logic diodes;
   (d) interconnections between said transistors and said logic diodes; and, wherein
   (e) at least one of said plurality of Schottky barrier logic diodes is formed in a trench having sidewalls which are covered by sidewall oxide filaments.

5. The integrated circuit of claim 4, wherein:
   (a) each of said trenches for said clamp diodes has a sidewall which extends through a base to collector.

6. The integrated circuit of claim 4 wherein:
   (a) said substrate is silicon with a heavily doped buried layer;
   (b) each of said logic diodes includes a titanium tungsten to silicon Schottky barrier; and
   (c) each of said clamp diodes includes a platinum silicide to silicone Schottky barrier.

* * * * *